United States Patent
Binnard (10) Patent No.: US 7,656,062 B2
(45) Date of Patent: Feb. 2, 2010

(54) SPLIT COIL LINEAR MOTOR FOR Z FORCE

(75) Inventor: Michael B. Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/425,793

(22) Filed: Jun. 22, 2006

(65) Prior Publication Data
US 2006/0232142 A1 Oct. 19, 2006

Related U.S. Application Data

(63) Continuation of application No. 10/935,995, filed on Sep. 8, 2004, now abandoned.

(51) Int. Cl.
*H02K 41/00* (2006.01)
(52) U.S. Cl. .................. 310/12.15; 310/12.05
(58) Field of Classification Search ............ 310/12–14, 310/112–114, 154.05, 154.06, 154.33
See application file for complete search history.

(56) References Cited

U.S. PATENT DOCUMENTS

| | | | | |
|---|---|---|---|---|
| 4,766,358 A | * | 8/1988 | Higuchi | 318/135 |
| 5,808,381 A | * | 9/1998 | Aoyama et al. | 310/12 |
| 5,907,199 A | * | 5/1999 | Miller | 310/12 |
| 5,910,691 A | * | 6/1999 | Wavre | 310/12 |
| 6,225,712 B1 | * | 5/2001 | Miyamoto et al. | 310/15 |
| 6,252,314 B1 | | 6/2001 | Ebinuma | |
| 6,590,355 B1 | * | 7/2003 | Kikuchi et al. | 318/135 |
| 6,864,601 B2 | * | 3/2005 | Sogard | 310/12 |
| 6,866,107 B2 | * | 3/2005 | Heinzmann et al. | 180/7.1 |
| 2004/0051402 A1 | | 3/2004 | Hazelton et al. | |
| 2006/0221323 A1 | | 10/2006 | Cox et al. | |

FOREIGN PATENT DOCUMENTS

JP 2004-187401 7/2004

\* cited by examiner

*Primary Examiner*—Dang D Le (57) ABSTRACT

Methods and apparatus for enabling a coil to be used to provide a net force along more than one axis are disclosed. According to one aspect of the present invention, an actuator includes a magnet assembly and a coil assembly. The coil assembly moves at least partially within the magnet arrangement, and includes a top coil half and a bottom coil half. The top coil half and the bottom coil half are independently controllable such that a first current applied to the top coil half may be independently applied from a second current applied to the bottom coil half.

17 Claims, 8 Drawing Sheets

SPLIT COIL LINEAR MOTOR FOR Z FORCE

CROSS-REFERENCE TO RELATED APPLICATIONS

This application is a continuation of U.S. application Ser. No. 10/935,995 filed Sep. 8, 2004, incorporated in its entirety for all purposes.

BACKGROUND OF THE INVENTION

1. Field of Invention

The present invention relates generally to actuators. More particularly, the present invention relates to a coil design which enables an actuator such as a linear motor to provide a net force in along both an x-axis and a z-axis.

2. Description of the Related Art

For many machines or instruments such as photolithography machines which are used in semiconductor processing, space is often at a premium. The lack of available space often forces components to be sized as compactly as possible. As a result, restricting the size of a component that is arranged to provide a particular force or motion allows the space in an overall machine to be efficiently utilized.

Figure 1:
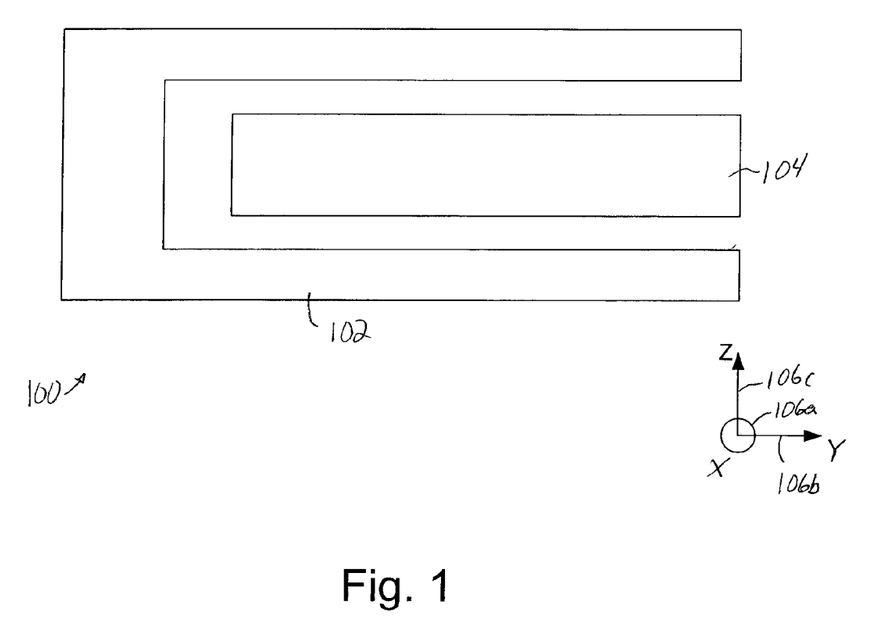
FIG. 1 is a diagrammatic representation of a magnet and a coil.

Many machines include linear motors which may be used to provide a force that is used to drive an object or a structure, e.g., a stage of a photolithography machine. FIG. 1 is a diagrammatic representation of a typical linear motor. A linear motor 100 includes a magnet structure 102 and a coil structure 104. Often, linear motor 100 is sized such that a dimension along an x-axis 106$a$ and a dimension along a y-axis 106$b$ are significantly larger than a dimension along a z-axis 106$c$. When a current is applied to coil 104, a force, i.e., a non-zero net force, is generated along x-axis 106$a$.

Figure 2A:
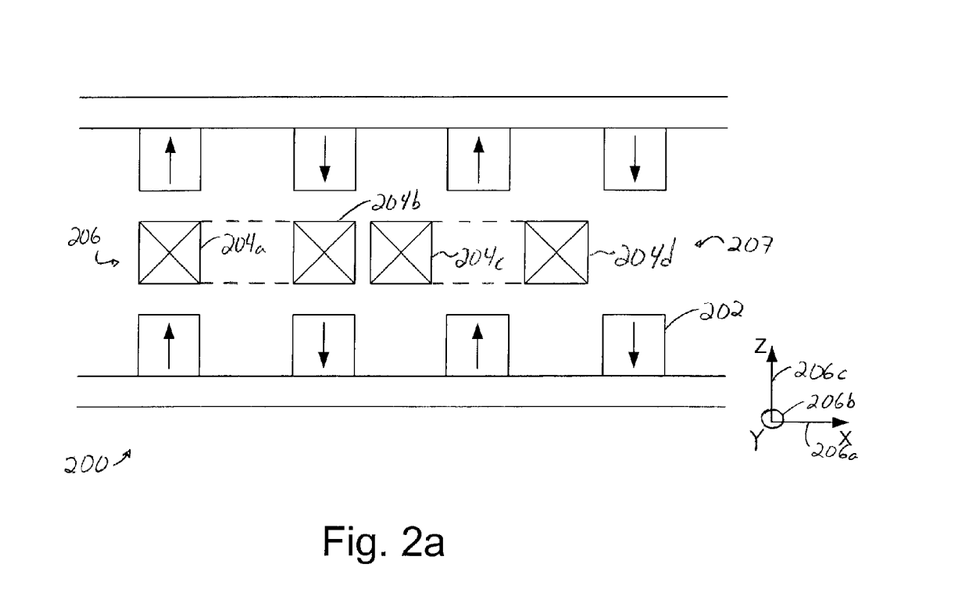
FIG. 2a is a diagrammatic cross-sectional representation of an opposed set of magnets and a coil.
Figure 2B:
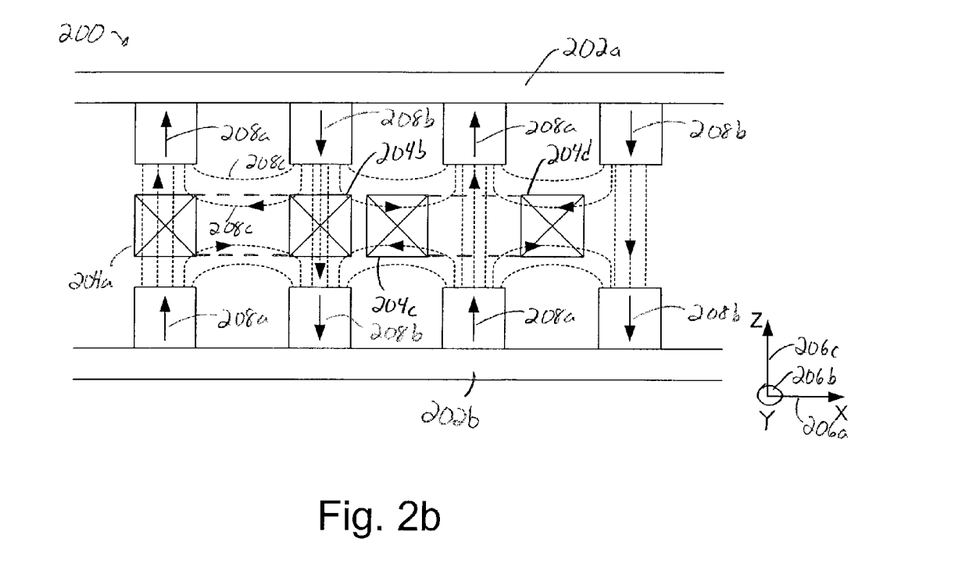
FIG. 2b is a diagrammatic cross-sectional representation of an opposed set of magnets and a coil, i.e., magnets 202 and coil 204 of FIG. 2a, with magnetic flux lines.

FIG. 2$a$ is a diagrammatic cross-sectional representation of a symmetric linear motor. A linear motor 200 includes magnets 202 and coils 206, 207. Coil 206 includes sections 204$a$, 204$b$, while coil 207 includes sections 204$c$, 204$d$. Sections 204$a$, 204$b$ are arranged to produce force in an x-direction 206$a$, while sections 204$c$, 204$d$ are arranged to produce force in a z-direction 206$c$. As shown in FIG. 2$b$, when current is applied to coils 206, 207 in a y-direction 206$b$, magnetic flux 208$c$ is generated in x-direction 206$a$, and magnetic flux 208$a$, 208$b$ is generated in z-direction 206$c$. Since force that is generated by linear motor 200 is generally perpendicular to both applied current and magnetic flux 208, coil 206 produces a force in x-direction 206$a$. Coil 207 is capable of generating force in z-direction 206$c$. However, since magnetic flux 208$a$ is directed in a substantially opposite direction from magnetic flux 208$b$, the net force in z-direction 206$c$ is effectively zero.

Since linear motor 200 effectively only produces a non-zero net force in x-direction 206$a$, linear motor 200 may generally only be used to apply force on an object, as for example a stage assembly (not shown), in x-direction 206$a$. In order for the object to be moved in z-direction 206$c$, an additional linear motor which is arranged to apply a force substantially only in z-direction 206$c$ generally must also be coupled to object. While the use of linear motor 200 and an additional linear motor may be effective in allowing an object to move in both x-direction 206$a$ and z-direction 206$c$, the use of the additional linear motor may not always be possible due to space constraints within an overall system. Further, the use of an additional linear motor may cause issues associated with the addition of mass to the overall system, and the generation of heat within the overall system. As will be appreciated by those skilled in the art, additional mass may cause vibrations within the overall system, while additional heat may adversely affect the performance of various components, e.g., sensors, within the overall system.

A planar motor, i.e., a motor with a substantially flat plate of magnets and coils, is arranged to provide force in an x-direction and a z-direction. Hence, a single planar motor may be used in lieu of two linear motors to provide a non-zero net force in an x-direction and a z-direction. However, a planar motor is generally more complicated to control than a linear motor. Further, since many systems are arranged to use linear motors, the use of a planar motor instead of one or more linear motors may be impractical.

Therefore, what is desired is a method and an apparatus which enables a non-zero net force to be efficiently applied in an x-direction and a z-direction. That is, what is needed is a method and an apparatus which allows a single linear motor to be used to apply non-zero net forces along an x-axis and a z-axis.

BRIEF SUMMARY OF THE INVENTION

The present invention relates to a split coil design which enables the overall direction in which a net force is applied by an actuator to be altered. According to one aspect of the present invention, an actuator includes a magnet assembly and a coil assembly. The coil assembly moves at least partially within the magnet arrangement, and includes a top coil half and a bottom coil half. The top coil half and the bottom coil half are independently controllable such that a first current applied to the top coil half may be independently applied from a second current applied to the bottom coil half.

In one embodiment, the top coil half and the bottom coil half cooperate to produce a substantially non-zero net force along a second axis when the first current and the second current are applied in substantially opposite directions along a third axis. In such an embodiment, the top coil half and the bottom coil half also cooperate to produce a substantially negligible net force along a first axis along which the coil assembly moves at least partially within the magnet arrangement.

An actuator, e.g., a linear motor, that provides a non-zero net force along both an x-axis and a z-axis allows forces to be applied along both axes substantially without requiring the use of an additional actuator. Therefore, no extra space is generally needed within a system to provide the capability of generating non-zero net forces along two axes. An actuator that provides non-zero net forces along two axes may be achieved by utilizing a split coil which coil sections which may be independent controlled, e.g., controlled using independent currents.

According to another aspect of the present invention, an actuator includes a magnet arrangement and a coil assembly that moves at least partially within the magnet arrangement along a first axis and includes a first coil and a second split coil. The first coil is arranged to provide a substantially non-zero net force along the first axis and the second split coil is arranged to provide a substantially non-zero net force along a second axis that is substantially perpendicular to the first axis. In one embodiment, the second split coil includes a first coil half and a second coil half that are substantially independently controlled such that a first current is applied to the first coil half in a substantially opposite direction along a third axis from a second current applied to the second coil half.

In accordance with another aspect of the present invention, a method for controlling an actuator that has a magnet assembly and a coil assembly, which has a first coil and a second coil, and moves at least partially within the magnet assembly along a first axis includes applying a first current to the first coil and applying a second current to the second coil. The second current is applied substantially independently from the first current, wherein applying the first current and the second current causes a substantially non-zero net force to be generated.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE INVENTION

Many systems such as photolithography systems used in semiconductor wafer processing have spatial constraints. It is often not possible to add additional components such as actuators to the systems due to a lack of space. By way of example, when it is desired for an object that is coupled to a linear motor, i.e., a linear motor which is arranged to enable force to be generated along an x-axis, to be moved along a z-axis, it may not be possible to couple another linear motor, i.e., a linear motor which is arranged to enable force to be generated along a z-axis, to the object. When the addition of another linear motor is not possible, then the overall performance of the system which includes the object may be compromised, as the object may not be moved along the z-axis as desired.

Configuring an actuator such as a linear motor to provide a non-zero net force along both an x-axis and a z-axis allows forces to be applied along both axes substantially without requiring the use of an additional linear motor or voice coil motor. As a result, no space is needed within an overall system to accommodate an additional linear motor. In one embodiment, by utilizing a split coil, e.g., a plurality of coils, within the linear motor, the current applied to top and bottom halves of the split coil may be controlled such that forces along a z-axis may be controlled.

Figure 3:
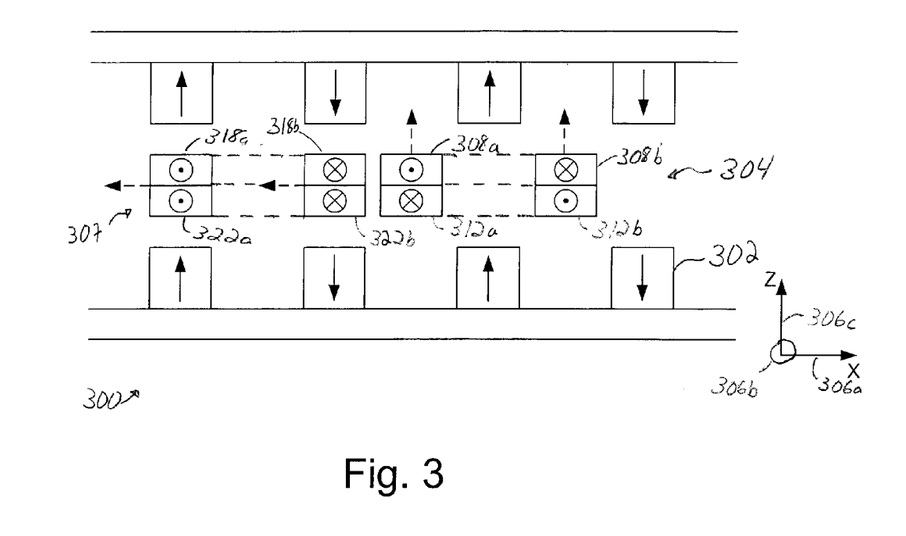
FIG. 3 is a diagrammatic cross-sectional representation of an opposed set of magnets and a split coil in accordance with an embodiment of the present invention.

With reference to FIG. 3, a split coil will be described in accordance with an embodiment of the present invention. A motor 300 includes magnets 302, a split coil 304 that is made up of a top half 308 and a bottom half 312, and a split coil 307 that is made up of a top half 318 and a bottom half 322. In one embodiment, motor 300 may be a linear motor, although it should be appreciated that motor 300 may instead be a voice coil motor. The current provided to top half 308 and the current provided to top half 318 may be controlled substantially independently from the current provided to bottom half 308 and bottom half 322, respectively.

Split coil 304 may be arranged such that portions of top half 308a, 308b may have current flowing in an opposite direction along a y-axis 306b than portions of bottom half 312a, 312b, respectively, to provide a substantially non-zero net force along a z-axis 306c. Specifically, current may flow in portion 308a in an opposite direction along y-axis 306b than in portion 312a, and current may flow in portion 308b in an opposite direction along y-axis 306b than in portion 312b. When current in half 308 flows in an opposite direction along y-axis 306b from current in half 312, forces along x-axis 306a are effectively cancelled out. In other words, when current flows in half 308 in an opposite direction along y-axis 306b as current in half 312, the net force generated along x-axis 306a by split coil 304 is effectively zero when the currents have substantially the same magnitude, while the net force generated along z-axis 306c is non-zero. Hence, as shown, split coil 304 is arranged to provide a non-zero net force in a direction along z-axis 306c when currents of equal magnitude and opposite directions are applied to halves 308, 312. Reversing the direction in which current is applied to both top half 308 and bottom half 312 provides net force in the opposite direction along z-axis 306c.

While split coil 304 is arranged to provide non-zero net forces along z-axis 306c, in the embodiment as shown, split coil 307 is arranged to provide non-zero net forces along an x-axis 306a. Split coil 307 is arranged such that portions of top half 318a, 318b may have current flowing in the same direction along y-axis 306b as portions of bottom half 322a, 322b, respectively, to provide force along x-axis 306a. When approximately equal current flows in the same direction in top half 318 and bottom half 322, the net force along z-axis 306c is substantially zero, while there is a non-zero net force along x-axis 306a.

By allowing the current that flows through top half 308 and bottom half 312 of split coil 304 to flow in opposite directions along y-axis 306b and by allowing the current that flows through top half 318 and bottom half 322 of split coil 307 to flow in the same direction along y-axis 306b, split coil 304 effectively enables motor 300 to generate a non-zero net force with respect to z-axis 306c while split coil 307 effectively enables motor 300 to generate a non-zero net force with respect to x-axis 306a. As a result, motor 300 is capable of being used to provide non-zero net forces in both a direction along x-axis 306a and a direction along z-axis 306c.

Figure 4A:
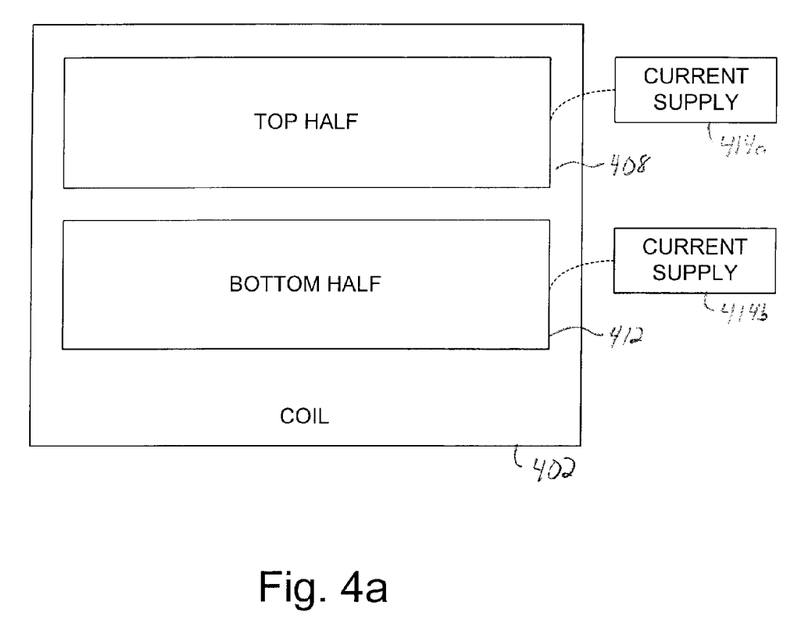
FIG. 4a is a block diagram representation of a split coil assembly with substantially separate current supplies in accordance with an embodiment of the present invention.

Separate current sources are generally needed for the top half and the bottom half of a split coil, e.g., top half 308 and bottom half 312 of split coil 304. As a motor moves, the directions in which current is applied to the split coil may vary due to commutation. FIG. 4a is a block diagram representation of a split coil assembly with substantially separate current supplies in accordance with an embodiment of the present invention. A split coil assembly 402 includes a top half 408 and a bottom half 412. Top half 408 is coupled to a current supply 414a which is arranged to provide a current to top half 408, while bottom half 412 is coupled to a current supply 414b which is arranged to provide a current to bottom half 412. Current supplies 414 may each be coupled to a current amplifier (not shown), and controlled by a current command (not shown). In one embodiment, current supply 414a provides a current of a given magnitude to top half 408 in one direction, while current supply 414b provides a current of the same magnitude to bottom half 412 in an opposite direction, although it should be appreciated that current supplies 414a, 414b may also provide currents in the same direction or of different magnitudes to top half 408 and bottom half 412, respectively.

Figure 4B:
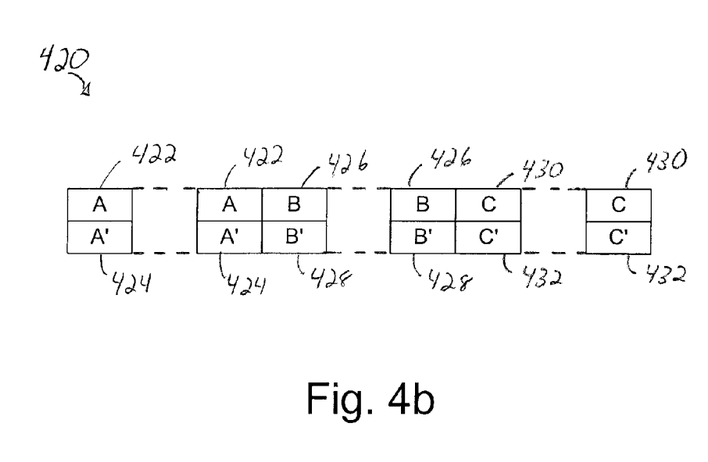
FIG. 4b is a diagrammatic block diagram representation of a split coil assembly associated with a three-phase motor in accordance with an embodiment of the present invention.

A motor which uses split coils may, in one embodiment, be a 3-phase motor which uses multiple split coils. FIG. 4b is a representation of a split coil assembly that is suitable for use in a 3-phase motor in accordance with an embodiment of the present invention. A split coil assembly 420 includes a top 'A' coil 422, a bottom 'A'' coil 424, a top 'B' coil 426, a bottom 'B'' coil 428, a top 'C' coil 430, and a bottom 'C'' coil 432. Top coil 422 and bottom coil 424 generally make up one overall split coil, while coils 426, 428 and coils 430, 432 each also make up overall split coils.

The three phases of a motor which includes split coil assembly 420 are generally each 120 degrees out of phase. Each coil included in split coil assembly 420 generally has a separate current amplifier which enables the current provided to each coil to be controlled substantially independently. By way of example, top coil 422 may have a separate current amplifier from bottom coil 424 such that the current provided to top coil 422 and bottom coil 424 may be of a substantially equal magnitude, but provided in opposite directions.

Figure 4C:
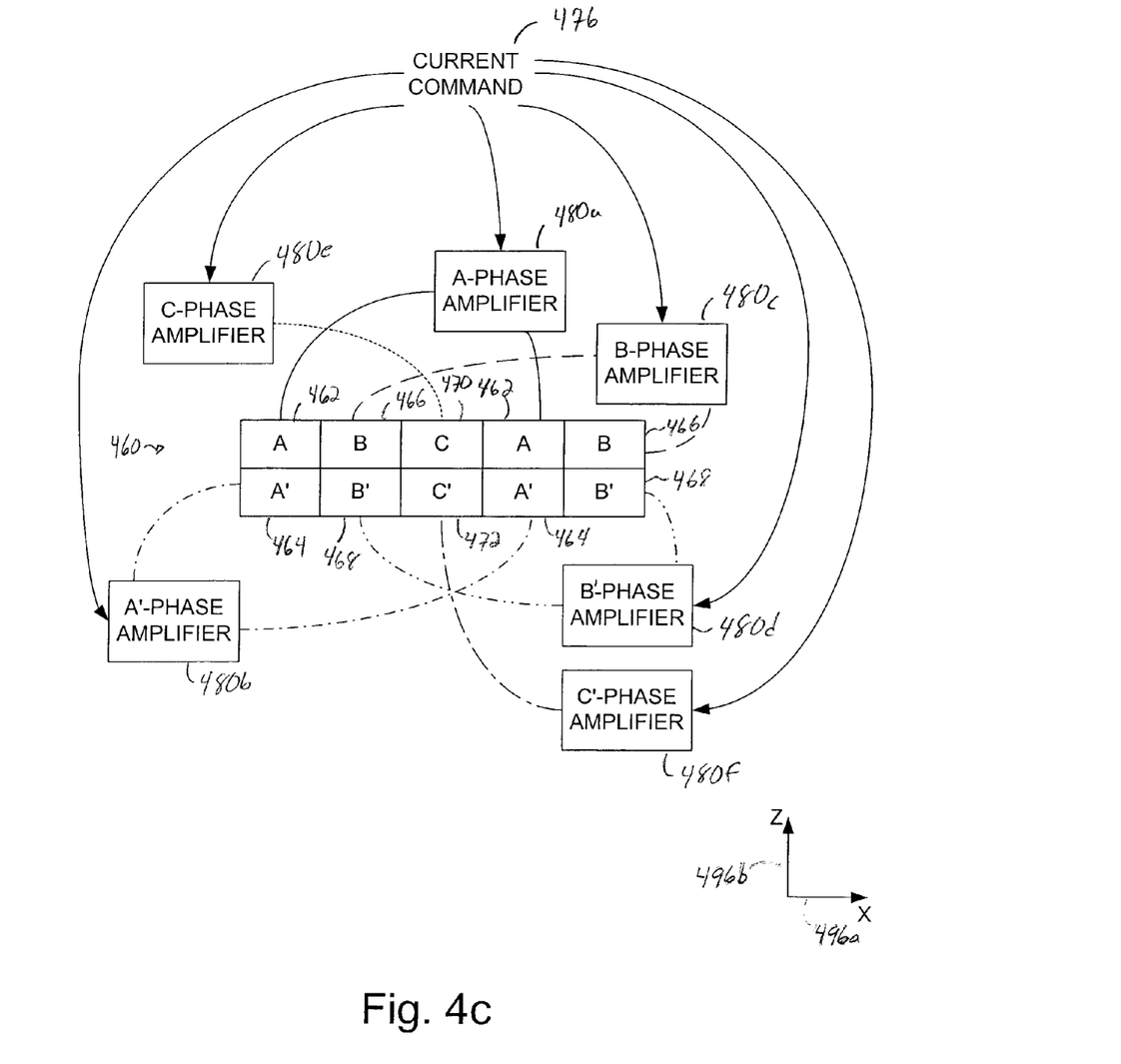
FIG. 4c is a diagrammatic block diagram representation of a split coil assembly with controlling amplifiers in accordance with an embodiment of the present invention.

In general, split coil assembly 420 may include any number of coils. That is, split coil assembly 420 may include a plurality of 'A' coil and 'A'' coil pairs, 'B' coil and 'B'' coil pairs, and 'C' coil and 'C'' coil pairs. With reference to FIG. 4c, an overall coil assembly which is suitable for use in a 3-phase motor and includes multiple coil pairs will be described in accordance with an embodiment of the present invention. A split coil assembly 460 includes any number of 'A' coils 462, and any number of 'A'' coils 464. Each 'A' coil 462 and each 'A'' coil 464 effectively forms an 'A' coil and 'A'' coil pair. As shown, split coil assembly 460 includes two 'A' coil and 'A'' coil pairs, although the number of 'A' coil and 'A'' coil pairs may vary widely. Similarly, the number of 'B' coils 466 and 'B'' coils 468 may vary, and the number of 'C' coils 470 and 'C'' coils 472 may also vary.

Each 'A' coil 462 is coupled to an A-phase amplifier 480a which may accept a current command 476, e.g., from a controller, to provide a particular amount of current to each 'A' coil 462. In general, each type of coil has a dedicated amplifiers 480a-f which is effectively controlled by current command 476. That is, 'A'' coil 464 is coupled to an A'-phase amplifier 480b, 'B' coil 466 is coupled to B-phase amplifier 480c, 'B'' coil 468 is coupled to B'-phase amplifier 480d, 'C' coil 470 is coupled to C-phase amplifier 480e, and 'C'' coil 472 is coupled to C'-phase amplifier 480e.

The current applied by each amplifier 480, which is commanded by current command 476, is typically a function of a desired amplitude of current ($A_x$) associated with an x-axis 496a and a desired amplitude of current ($A_z$) associated with a z-axis 496b, as well as the position ($\phi$) of a magnet (not shown) relative to split coil assembly 460. In one embodiment, the currents applied by each amplifier 480 may be expressed as follows:

$$I_A = A_x \sin\phi + A_z \cos\phi$$

$$I_{A'} = A_x \sin\phi - A_z \cos\phi$$

$$I_B = A_x \sin(\phi+120°) + A_z \cos(\phi+120°)$$

$$I_{B'} = A_x \sin(\phi+120°) - A_z \cos(\phi+120°)$$

$$I_C = A_x \sin(\phi+240°) + A_z \cos(\phi+240°)$$

$$I_{C'} = A_x \sin(\phi+240°) - A_z \cos(\phi+240°)$$

where $I_A$ is the current applied by amplifier 480a, $I_{A'}$ is the current applied by amplifier 480b, $I_B$ is the current applied by amplifier 480c, $I_{B'}$ is the current applied by amplifier 480d, $I_C$ is the current applied by amplifier 480e, and $I_{C'}$ is the current applied by amplifier 480f.

As discussed above with respect to FIG. 3, a portion of a split coil assembly that is arranged to provide a non-zero net force along an x-axis generally has substantially the same current applied in the same direction in both halves of a split coil. When the split coil moves relative to a magnet along the x-axis, the portion of the split coil that was arranged to provide a force along the x-axis may be positioned such that by changing the current applied to both halves of the portion of the split coil, i.e., by applying current to the bottom half in an opposite direction from the current applied to the top half, the portion then provides a substantially non-zero net force along a z-axis. In other words, when the relative motion between a split coil and a magnet is relatively large, portions of the split coil may effectively flip between being used to apply a non-zero net force along an x-axis and being used to apply a substantially non-zero net force along a z-axis. By varying the direction in which current is applied to a top coil and a bottom coil of a portion of a split coil, the direction of the net force applied by the portion may be varied.

Figure 5:
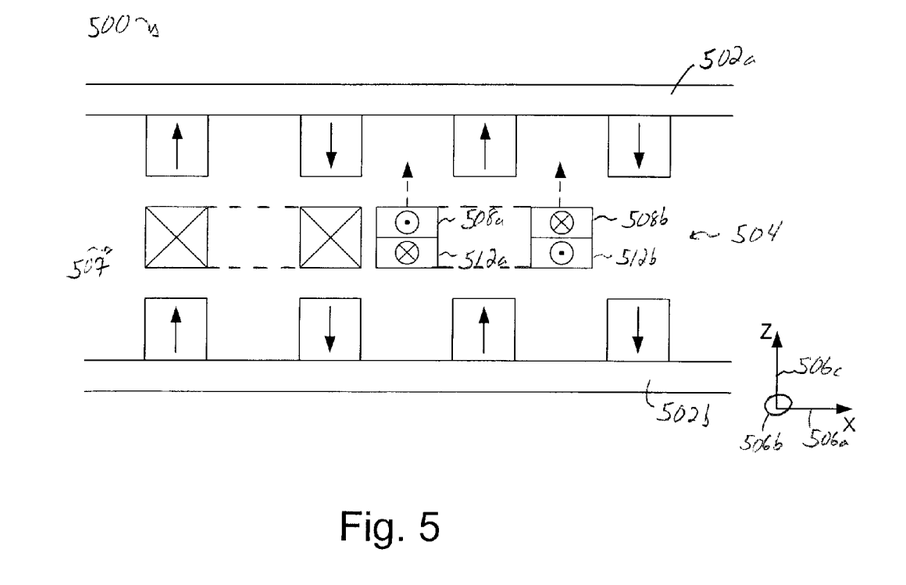
FIG. 5 is a diagrammatic cross-sectional representation of an opposed set of magnets and a coil assembly which includes a non-split coil and a split coil in accordance with an embodiment of the present invention.

In one embodiment, when the relative motion between a coil assembly and a magnet is relatively small along an x-axis, the use of a split coil in the portion of the coil assembly which is arranged to provide force along the x-axis may not be necessary, as that portion of the coil assembly is unlikely to be positioned to provide force along a z-axis. Hence, since the top half and the bottom half of that portion of the coil assembly will generally have current of substantially the same magnitude applied in the same direction, that portion of the coil assembly may be replaced by a conventional, or non-split, coil. FIG. 5 is a diagrammatic representation of a motor which includes a coil assembly that has both a split coil component and a non-split coil component in accordance with an embodiment of the present invention. A motor 500 includes magnets 502, as well as a split coil 504 and a non-split coil 507. Split coil 504 includes a top half 508 and a bottom half 512 which are positioned to provide a substantially non-zero net force along a z-axis 306c when current applied to top half 508 is of approximately the same magnitude as current applied to bottom half 512, but applied in an opposite direction along a y-axis 506b. Non-split coil 507 is positioned to apply a non-zero net force along an x-axis 506a.

When the relative motion of coils 504, 507 between magnet 502a and magnet 502b is relatively small with respect to x-axis 506a, non-split coil 507 will effectively rarely be positioned to provide a substantially non-zero net force along z-axis 506c. That is, in most instances, non-split coil 507 will be positioned only to provide a non-zero net force along x-axis 506a. Hence, the use of non-split coil 507 is typically appropriate, as non-split coil 507, which has a single applied current, is suitable for use in providing a non-zero net force along x-axis 506a.

Figure 6:
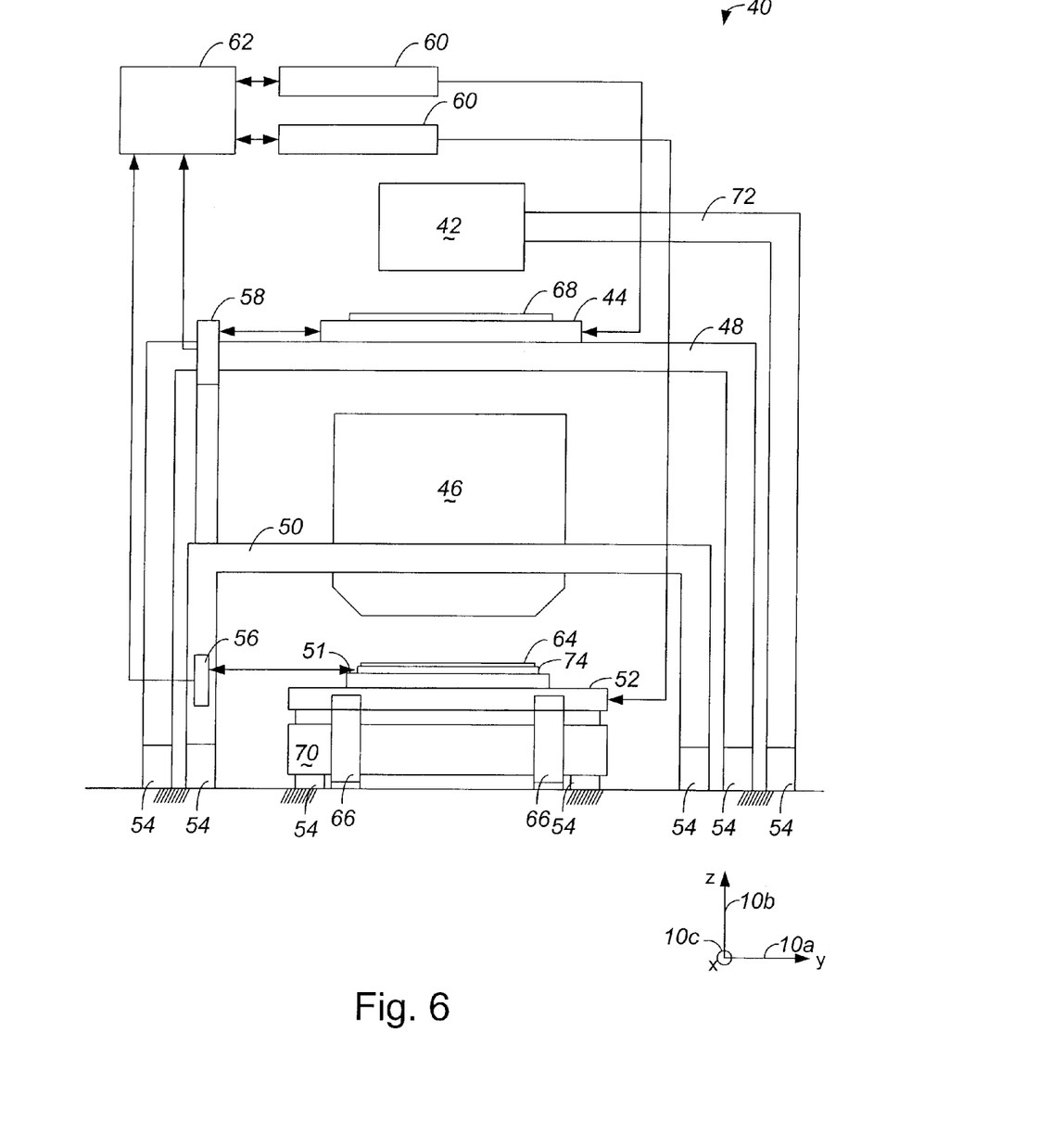
FIG. 6 is a diagrammatic representation of a photolithography apparatus in accordance with an embodiment of the present invention.

With reference to FIG. 6, a photolithography apparatus which may include an actuator such as a linear motor with a split coil design will be described in accordance with an embodiment of the present invention. A photolithography apparatus (exposure apparatus) 40 includes a wafer positioning stage 52 that may be driven by linear motors or by a planar motor (not shown), as well as a wafer table 51 that is magnetically coupled to wafer positioning stage 52 by utilizing substantially any suitable actuator such as an EI-core actuator. The motor or motors which drive wafer positioning stage 52 generally use electromagnetic force generated by magnets and corresponding armature coils arranged in two dimensions. A wafer 64 is held in place on a wafer holder or chuck 74 which is coupled either substantially directly to or indirectly, e.g., through a quasi-kinematic mount, to wafer table 51. Wafer positioning stage 52 and wafer table 51 are arranged to move in multiple degrees of freedom, e.g., between tone and six degrees of freedom, under the control of a control unit 60 and a system controller 62. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In the described embodiment, at least three electromagnetic actuators, e.g., EI-core actuators, (not shown) couple and move wafer table 51 along a y-axis 10a, an x-axis 10c, and about a z-axis 10b. The motor array of wafer positioning stage 52 is typically supported by a base 70. Base 70 is supported to a ground via isolators 54. Reaction forces generated by motion of wafer positioning stage 52 may be mechanically released to a ground surface through a frame 66. Reaction forces may be released to the floor or ground through a VCM or voice coil motor (not shown) that is substantially in contact with reaction frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground directly or via isolators 54. Illumination system 42 includes an illumination source, and is arranged to project a radiant energy, e.g., light, through a mask pattern on a reticle 68 that is supported by and scanned using a reticle stage 44 which includes a coarse stage and a fine stage. The radiant energy is focused through projection optical system 46, which is supported on a projection optics frame 50 and may be supported on the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of table 51 onto which a mirrored surface has been polished. Interferometer 56 outputs information on the position of wafer table 51 to system controller 62. In one embodiment, wafer table 51 has a force damper which reduces vibrations associated with wafer table 51 such that interferometer 56 may more accurately detect the position of wafer chuck 74. A second interferometer 58 is supported on optics frame 46, and detects the position of reticle stage 44 which supports reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer positioning stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes wafer 64 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 so that the next field of semiconductor wafer 64 is brought into position relative to illumination system 42, reticle 68, and projection optical system 46 for exposure. Following this process, the images on reticle 68 may be sequentially exposed onto the next field of wafer 64.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. No. 5,623,853 or U.S. Pat. No. 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which may include a split coil actuator, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 7:
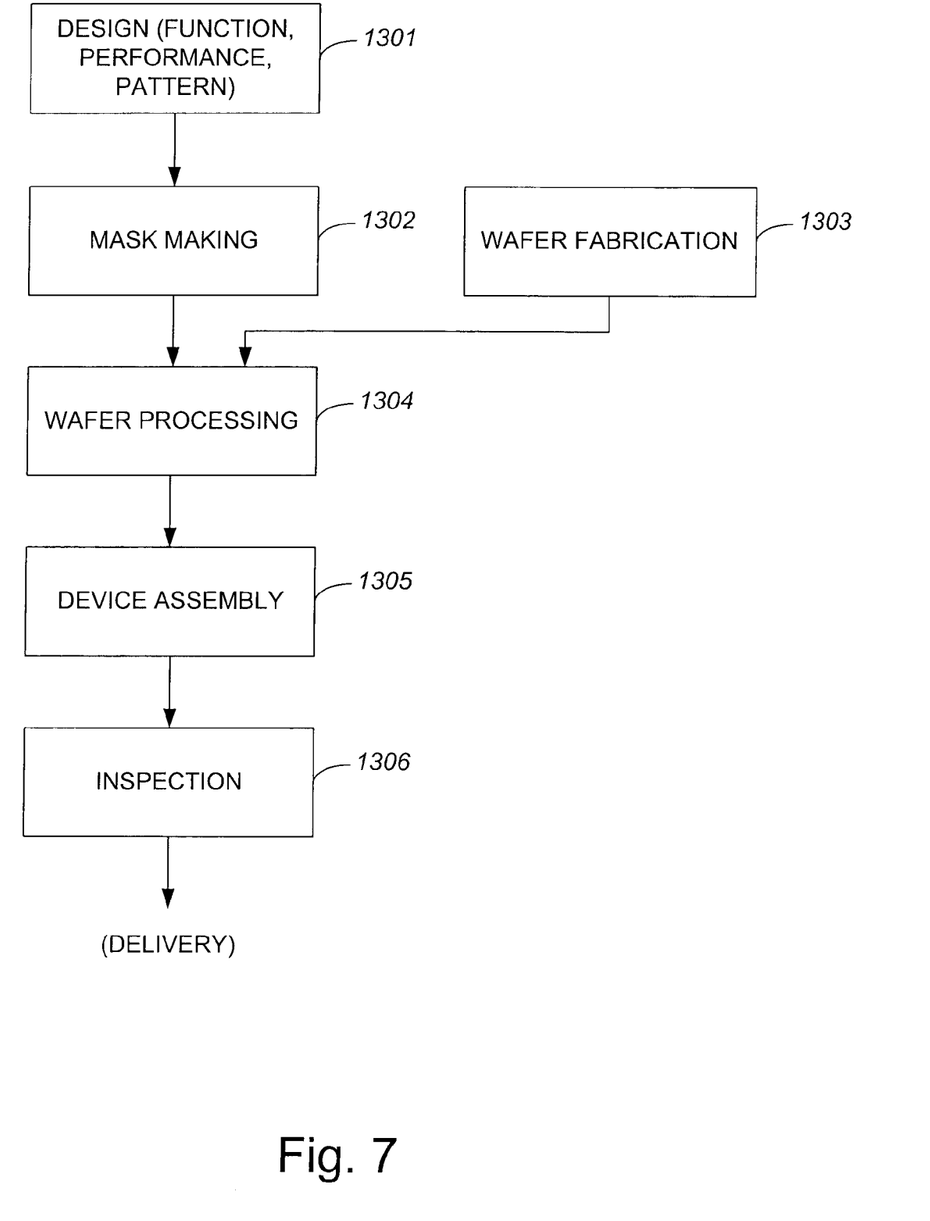
FIG. 7 is a process flow diagram which illustrates the steps associated with fabricating a semiconductor device in accordance with an embodiment of the present invention.

Further, semiconductor devices may be fabricated using systems described above, as will be discussed with reference to FIG. 7. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 8. In step 1305, the semiconductor device is assembled. The assembly of the semiconductor device generally includes, but is not limited to, wafer dicing processes, bonding processes, and packaging processes. Finally, the completed device is inspected in step 1306.

Figure 8:
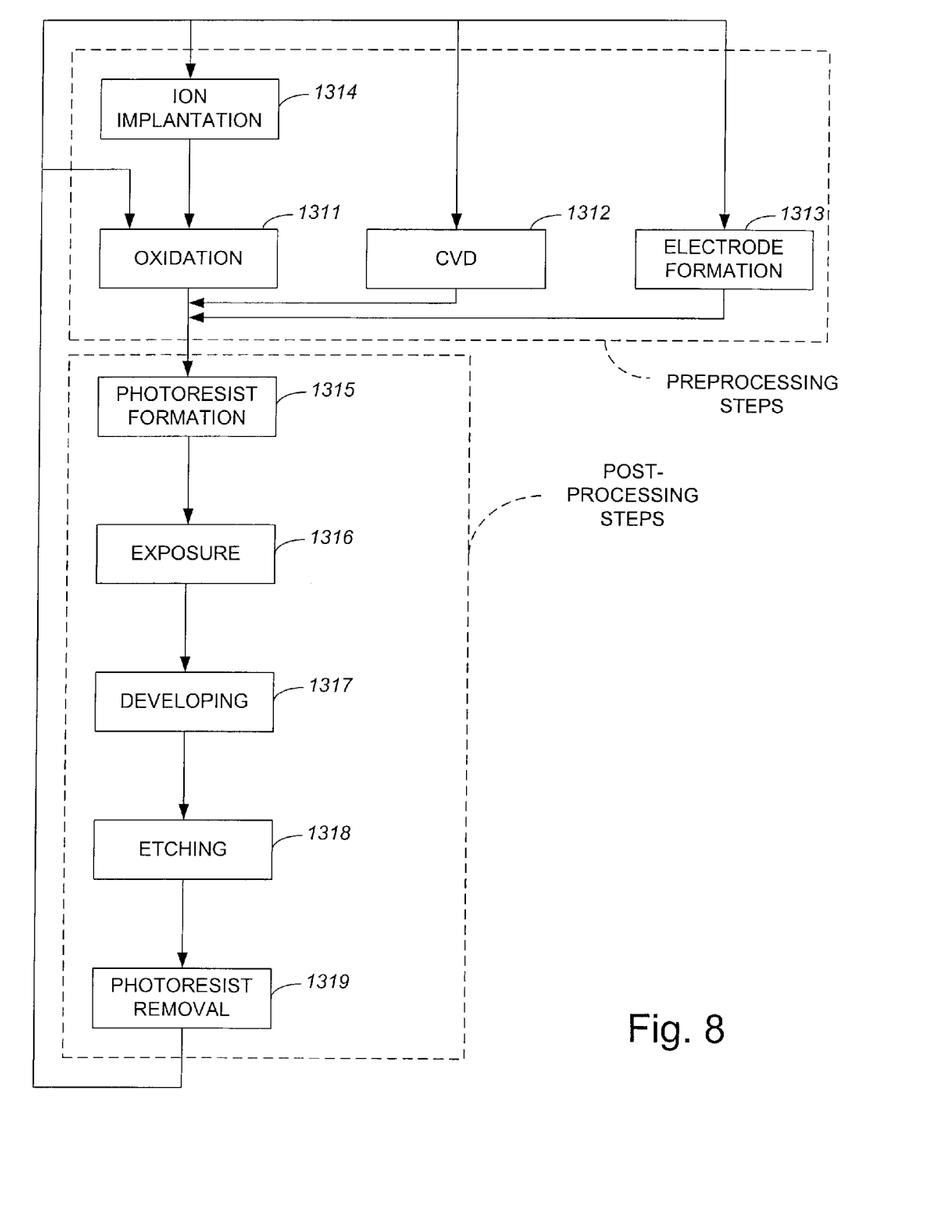
FIG. 8 is a process flow diagram which illustrates the steps associated with processing a wafer, i.e., step 1304 of FIG. 7, in accordance with an embodiment of the present invention.

FIG. 8 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, while an actuator with a split coil which has halves that may be substantially independently controlled has generally been described as being a linear motor, a split coil may be implemented for use in substantially any suitable actuator. Substantially any actuator which typically produces force in an x-direction and is to be configured to produce a non-zero net force in a z-direction may use a split coil which has halves that may be independently controlled. An actuator, e.g., a voice coil motor, which requires a relatively large force in a z-direction, but has a shape that is small in a z-direction, may also benefit from the use of a split coil.

An actuator which includes a split coil has been described as being suitable for use in a photolithography apparatus. Within a photolithography apparatus, an actuator with a split coil may be used to position a wafer stage, a reticle stage, or a wafer table, for example. An actuator which includes a split coil may also be suitable for use in substantially any other apparatus in which non-zero net forces in an x-direction and a z-direction are desired, but space constraints are such that the use of more than a single actuator to generate forces in two directions is impractical. In addition, an actuator which includes a split coil may be used with substantially any apparatus which needs a force in a z-direction, but requires that the dimension of the actuator in the z-direction is small.

The number of split coils in a coil assembly may vary depending upon the overall size of an actuator which uses the coil assembly without departing from the spirit or the scope of the present invention. Therefore, the present examples are to be considered as illustrative and not restrictive, and the invention is not to be limited to the details given herein, but may be modified within the scope of the appended claims.

The invention claimed is:

1. An actuator comprising:
a magnet arrangement including a plurality of magnets, the plurality of magnets being arranged to generate an alternating magnetic field along a first axis, the plurality of magnets being arranged in two rows; and
a coil assembly that moves relative to the magnet arrangement along the first axis and a second axis that differs from the first axis, the coil assembly including a first coil part and a second coil part, the first coil part having a first current applied to generate a first component force on the first coil part and the second coil part having a second current applied to generate a second component force on the second coil part, the first coil part and the second coil part being arranged to be substantially independently controlled such that a resultant force of the first component force and the second component force is exerted on the coil assembly along the second axis.

2. The actuator of claim 1 wherein the first current in the first coil part and the second current in the second coil part are applied in substantially opposite directions along a third direction that crossed the first axis and the second axis.

3. The actuator of claim 1 wherein the actuator is one selected from the group including a linear motor and a voice coil motor.

4. A stage apparatus comprising the actuator of claim 1.

5. An exposure apparatus comprising the stage apparatus of claim 4.

6. An actuator comprising:
a magnet arrangement including a plurality of magnets arranged with alternating polarities along a first axis, the plurality of magnets being arranged to generate a first magnetic flux which is along the first axis and a second magnetic flux which is along a second axis, the second axis being perpendicular to the first axis; and
a coil assembly including a first coil cooperating with the second magnetic flux to generate a first force that moves the coil assembly relative to the magnet arrangement along the first axis, the coil assembly further including a second coil cooperating with the first magnetic flux to generate a second force that moves the coil assembly relative to the magnet arrangement along the second axis.

7. The actuator of claim 6 wherein the second coil comprises a first coil part and a second coil part, a first current being applied to the first coil part and a second current being applied to the second coil part, the second current being controlled independently from the first current.

8. The actuator of claim 7 wherein the magnet arrangement comprises a first magnet set and a second magnet set opposed to the first magnet set with a gap along the second axis, the first magnet set and the second magnet set being arranged to generate an alternating magnetic field in the gap, and wherein the coil assembly is arranged in the gap, the coil assembly including the first coil part and the second coil part, the second coil part being stacked on the first coil part along the second axis.

9. The actuator of claim 7 wherein the first current and the second current are applied in opposite directions.

10. The actuator of claim 6 wherein the first coil and the second coil are a same coil, and the coil changes its state from the first coil into the second coil according to a position of the coil assembly relative to the magnet arrangement in the first axis.

11. The actuator of claim 10 wherein the coil comprises a first coil part on which a first current is applied and a second coil part on which a second current is applied, the second current being controlled independently from the first current.

12. The actuator of claim 11 wherein the coil generates the first force when the first current and the second current are applied in a same direction, the coil being arranged to generate the second force when the first current and the second current are applied in an opposite direction.

13. The actuator of claim 6 wherein the first coil and the second coil include a plurality of coils on which multi=phase currents are applied.

14. An actuator device which generates a first force in a first axis and a second force in a second axis, the second axis being perpendicular to the first axis, the actuator device comprising:
a magnet arrangement comprising a first magnet and a second magnet opposed to the first magnet with a gap along the second axis, the first magnet and the second magnet being arranged to generate an alternating magnetic field in the gap;
a coil assembly including a first coil part and a second coil part, the second coil part being stacked on the first coil part along the second axis, the coil assembly being arranged in the gap; and
a controller that controls a first current applied to the first coil part and a second current applied to the second coil part independently to control the first force and the second force independently.

15. The actuator device of claim 14 wherein the first coil part includes three separate coils and the second coil part includes another three separate coils, and wherein the controller applies a three-phase first current to the three coils in the first coil part and a three-phase second current to the three coils in the second coil part.

16. The actuator device of claim 14 wherein the controller changes a phase difference between the first current and the second current to control the first force and the second force independently.

17. The actuator device of claim 16 wherein the controller controls the first current and the second current such that an amplitude of the first current and the second current are a same value.

* * * * *